United States Patent [19]

Thomas

[11] 4,230,492

[45] Oct. 28, 1980

[54] ARYL SULFONIC ACID BASED STABILIZERS FOR PRESENSITIZED PLANOGRAPHIC PLATES

[75] Inventor: Daniel C. Thomas, Wheaton, Ill.

[73] Assignee: The Richardson Company, Des Plaines, Ill.

[21] Appl. No.: 870,196

[22] Filed: Jan. 17, 1978

Related U.S. Application Data

[63] Continuation of Ser. No. 676,296, Apr. 12, 1976, abandoned.

[51] Int. Cl.² ............... G03C 1/60; G03C 1/94; G03F 7/08
[52] U.S. Cl. ............................ 430/159; 430/168; 430/302
[58] Field of Search ............ 96/75, 8 GF, 91 R, 68, 96/115 R, 33, 49; 260/142; 101/455, 456, 467

[56] References Cited

U.S. PATENT DOCUMENTS

| | | | |
|---|---|---|---|
| 2,649,373 | 8/1953 | Neugebawer et al. | 96/75 |
| 3,153,592 | 10/1964 | Klimkowski et al. | 96/91 R |
| 3,232,783 | 2/1966 | Deal et al. | 96/75 |
| 3,300,309 | 1/1969 | Chu | 96/75 |
| 3,353,984 | 11/1969 | Landau | 96/75 |
| 3,503,330 | 3/1970 | Chu | 96/33 |
| 3,549,365 | 12/1970 | Thomas | 96/33 |
| 3,554,751 | 1/1971 | Thomas | 96/75 |
| 3,669,660 | 6/1972 | Golda et al. | 96/49 |
| 3,756,823 | 9/1973 | Ten Haaf et al. | 96/75 |
| 3,808,004 | 4/1974 | Thomas et al. | 96/68 |

*Primary Examiner*—Charles L. Bowers
*Attorney, Agent, or Firm*—Lockwood, Dewey, Alex & Cummings

[57] ABSTRACT

A stabilizer, applied either as a coating over the sub-base layer of a presensitized planographic plate or blended into the sensitizer layer thereof, prevents degradation of the sensitizer enabling such plates to be stored over prolonged periods of time without loss of image quality or printing performance. The stabilizer is an aryl sulfonic acid or derivative thereof and, preferably, a haloaryl sulfonic acid or alkali metal salt thereof. In a particularly preferred presensitized plate, a p-chlorobenzene sulfonic acid coating is directly applied to a silicated anodized aluminum plate base and forms a separate layer interposed between the silicate sub-base and a water soluble diazo resin sensitizer layer.

4 Claims, No Drawings

ARYL SULFONIC ACID BASED STABILIZERS FOR PRESENSITIZED PLANOGRAPHIC PLATES

BACKGROUND AND DESCRIPTION OF THE INVENTION

This is a continuation of application Ser. No. 676,296, filed Apr. 12, 1976 now abandoned.

The present invention generally relates to presensitized lithographic plate stabilizers and, more particularly, to the use of aryl sulfonic acid based stabilizers in presensitized planographic plates to prevent degradation of the sensitizer over extended periods of time. In this regard, an important embodiment of the present invention is directed to the use of haloaryl sulfonic acid based stabilizers in presensitized planographic plates having a silicated anodized aluminum plate base and water soluble diazo resin sensitizer coating.

Presensitized printing plates, especially those used for planographic or lithographic printing processes, generally comprise a plate base or support member, a sub-base coating and a photosensitive coating. The plate base typically is a flexible sheet such as paper, metal or plastic which is treated with a suitable sub-base coating to provide the same with a hydrophilic surface and upon which a photosensitive coating or layer is then applied.

The photosensitive layer, depending upon whether the plate is positive or negative working, will become solubilized or insolubilized upon exposure to actinic radiation. For example, with negative working planographic plates, the photosensitive layer commonly is a diazo resin which, when struck by light, becomes insoluble. Thereafter the unexposed, unreacted portion of the sensitized material is removed from the plate leaving the hydrophilic sub-base material exposed. In such plates, the photosensitive layer is oleophilic in order to attract and take hold of the organic ink and allow the transfer of such ink to the printed surface as a printed image.

In the typical production of presensitized lithographic plates, the plate base can be aluminum which is anodized, brush grained, or otherwise treated to cause the surface of such plate base to readily accept and bind tightly with the sub-base. The sub-base material, for example, a silicate, in addition to imparting hydrophilic properties to the plate base, also prevents reaction between the surface of the plate base and the sensitizer.

Typically the sensitizer which is placed over the sub-base must be formulated so that it will not react with the sub-base material and be relatively inert when such plate is stored for considerable periods of time in heat and humidity since, when such presensitized plates become aged, the sensitizer is partially reacted causing unsatisfactory performance during printing. Such aging is typically referred to in the art as the "dark reaction" and must be eliminated to produce presensitized plates having acceptable shelf lives. I have found that through the use of an aryl sulfonic acid based material as a stabilizer I can prevent substantial degradation of presensitized lithographic or planographic plates. This stabilizer can be applied as a separate layer over the sub-base layer before applicaton of the photosensitive layer or blended into the sensitizer layer itself. Presensitized lithographic plates which incorporate these stabilizers are able to be stored over extended periods of time under varying conditions and are essentially free of blinding and are characterized by improved printing performance, i.e. they are long running, non-scumming and yield high quality reproductions when run on a lithographic press.

In accordance with an important aspect of the present invention, an improved and highly stable presensitized printing plate especially adaptable for planographic or lithographic printing is provided which includes as a stabilizer, an aryl sulfonic acid or derivative thereof, which is applied either as a coating over the sub-base layer or blended into the sensitizer layer. Generally the haloaryl sulfonic acids and salts thereof, particularly chlorobenzene sulfonic acid, are preferred for use as stabilizers in the presensitized lithographic plates of the present invention. Particularly advantageous presensitized lithographic plates embodying the present invention include an anodized aluminum plate base, a silicate sub-base, a p-chlorobenzene sulfonic acid stabilizer coating applied to such sub-base, a water soluble diazo resin photosensitizer layer applied over the stabilizer coating, and a photopolymerizable coating such as, for example, a phenoxy cinnamate photopolymer, applied over the diazo resin layer.

Accordingly, an object of the present invention is to provide a presensitized lithographic plate characterized by improved stability which can be stored over extended time periods under widely varying conditions without loss of image quality or printing performance. Another object is to provide a presensitized lithographic plate having an anodized aluminum plate base and water soluble diazo resin sensitizer layer having, as a stabilizer, an aryl sulfonic acid or derivative thereof, and preferably a haloaryl sulfonic acid or salt thereof such as, for example, p-chlorobenzene sulfonic acid or an alkali metal salt thereof. These and other objects of the present invention will be apparent from the following further detailed description of this invention.

As previously noted, presensitized printing plates intended for use in lithographic or planographic printing processes include a plate base or support member, a suitable coating applied thereto which renders the surface thereof hydrophilic, a sensitizer and, in accordance with the present invention, an aryl sulfonic acid based stabilizer which is interposed either as a separate layer between the sub-base and sensitizer or which is blended directly into the sensitizer. If desired, the presensitizer printing plates of the present invention, in instances wherein the sensitizer is a water soluble diazo resin, may also include a photopolymer layer which is applied over the diazo resin sensitizer.

Typically, the support member or plate base is a flexible sheet-like material composed of paper, metal or plastic. In this regard, it is important to note that the present invention finds advantageous utility with anodized aluminum plate bases. In accordance with known techniques, the anodized plate base is brush grained or otherwise suitably treated to improve its ability to bond with the sub-base coating and then washed to remove oils and contaminants which may be present on the surface thereof after such operations.

Many sub-base materials are available, each with its own advantage and disadvantage. Suitable sub-bases which are applied by well known commercial processes include phytic acid, melamine-formaldehyde condensation resin overcoated with polyacrylamide, and thereafter treated with zirconium acetate, urea-formaldehyde, titanium ortho esters, silane-acrylics, and, preferably, the silicate sub-base of U.S. Pat. No. 2,714,066. In addition, other sub-bases which are satisfactory include gelatin, polyacrylic acid and water soluble salts thereof, polymethacrylic acid and water soluble salts thereof, carboxymethyl cellulose, carboxymethyl hydroethyl cellulose, some titanates, modified resins of urea-formaldehyde and melamine-formaldehydes, polyvinyl alcohols, ferrocyanides, bicromates of sodium, potassium and ammonium and the oxides of the metal forming the plate as well as other sub-base materials well known in the art. Combinations of the above are also suitable.

The stabilizer of the present invention which is used to prevent the adverse effects from high temperature and humidity conditions includes all water soluble structures exhibiting aromaticity and can be generally referred to as an aryl sulfonic acid based material. Such material can be depicted by the following general formula:

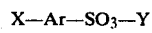 (1)

wherein X is hydrogen or halogen, Y is H or an alkali metal, and Ar is an aromatic group having up to 12 carbon atoms including, for example, phenylene, naphthalene, derivatives thereof, anthracene, phenanthrene and the like, and heterocyclic structures such as, for example, derivatives of pyridine, furan, thiophene, pyrrole, quinoline, indole, and the like. In the preferred embodiments of the present invention, Ar is phenylene or naphthalene.

A preferred embodiment of the stabilizer of the present invention can be represented by the following equation:

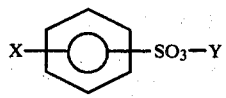 (2)

wherein X is H, chloro, fluoro, bromo or iodo, Y is a cation selected from the group consisting of hydrogen, lithium, potassium, sodium, amines, substituted amines and other suitable cations. Preferably Y is hydrogen or sodium producing in the latter instance the sodium salt of the halobenzene sulfonic acid.

The position of the substituents on the aromatic nucleus can vary depending upon the methods used to make the materials and the specific substituents present at the halo or on the sulfonic segments. Preferably, however, such substitution is in the para position. The methods of production of the aryl sulfonic acid and haloaryl sulfonic acids and derivatives thereof are well known in the art and, as such, it is not deemed necessary to explicitly repeat such methods herein.

In manufacturing presensitized plates embodying the present invention, a plate base, for example, an aluminum sheet, after being anodized and brush grained, is washed to remove oils and contaminants which might be present on the plate after such operations. The plate base is then treated with the sub-base material and in instances in which a silicate sub-base is used, the plate base is passed through a solution of warm silicate material. Thereafter, depending upon whether the stabilizer is added to the sensitizer or placed on the plate as a separate layer, the plate base can be further treated.

In instances in which the stabilizer is desired to be placed as a separate layer upon the sub-base, an aqueous solution of a few weight percent (e.g. 1–5%) of the stabilizer material can be roller coated over the sub-base and thereafter allowed to dry. Then the sensitizer can be roller coated over the stabilizer and allowed to dry. In the instances in which the stabilizer is desired to be incorporated into the diazo resin or the sensitizer material, it can be roller coated over the sub-base along with the sensitizer.

When mixing the stabilizer with the sensitizer, it can also vary in concentration and in its ratio with the diazo material. A typical concentraton of stabilizer for such use would be from about 0.05% to 0.3% by weight, based on the weight of diazo resin.

The sensitizer material which can be placed over the sub-base material typically includes diazo and diazonium resins, compounds and salts which are light sensitive and water soluble or dispersible in concentrations used in the aqueous formulations used to place such materials on the plate. Illustrative examples of diazo resins which are suitable as water dispersible diazo photosensitizers are the condensation products of an aldehyde with a diazo compound having an amine substitute such as, for example, the water soluble condensation product of para-diazo diphenylamine and formaldehyde which is commercially available under the trademark "Diazo Resin No. 4" manufactured by Fairmont Chemical Co. This particular diazo is a preferred diazo photosensitizer. Typically such materials can be furnished as salts such as zinc chloride salts. Other diazo compounds which can be used include the diazo oxides such as pyrido [1,2-a] benzimidazol-8-y13 (4H)-diazo-4 (3H)-oxo-1-naphthalene sulfonate.

Diazonium compounds which can also be used include such materials as 4'-bromo-diphenylamine-4-diazonium chloride; 4'-chlorodiphenyl-amine-4-diazonium chloride; 4-methoxy-diphenyl-amine-4-diazonium chloride; 3'-methoxy-diphenylamine-4-diazonium chloride; 3'-propoxy-diphenylamine-4-diazonium chloride; X, $X_1$, $X_2$-tribromodiphenylamine-4-diazonium chloride; 4'-methyl-diphenylamine-4-diazonium chloride; 4'-hydroxyl-diphenylamine-4-diazonium chloride; 4'-benzoylamine-diphenylamine-4-diazonium chloride; 4'-fluorodiphenylamine-4-diazonium chloride; 2-anilido-sulfonyl-diphenylamine-4-diazonium chloride; 2-(P-toluene-sulfonyl-amino)-diphenylamine-4-diazonium chloride; P-diazo-N-ethyl-N-benzyl aniline ½ $ZnCl_2$; 4' diazo-2-chloro-N,N'-diethylaniline-½ $ZnCl_2$; and other similar and well known diazonium materials.

As described above, the use of the specific stabilizer of the present invention prevents degradation of the diazo sensitizer when stored for extended periods of time. Additionally such stabilizer also prevents degradation of the diazo sensitizer when such plate is exposed to extreme conditions such as high temperature and humidity conditions for extended periods of time. Such high temperature together with high humidity conditions characteristically cause most presensitized plates, especially those which contain diazo, diazonium or other related diazo compounds as a sensitizer layer, to be subjected to the previously referred to "dark reaction". This "dark reaction" causes the diazo sensitizer to lose its light sensitivity, become partially cross-linked, lose water solubility and, when exposed, to result in the presensitized plate having partially cross-linked diazo sensitizer which causes overall toning and scum on a lithographic press.

One method of determining the extent of the "dark reaction" and/or degradation of the plate after being subjected to storage conditions is to expose the plate to a standardized step wedge and determine the solid and visible wedges present after development of the plate. A sensitivity guide, identified as "The Lithographic Technical Foundation" (LTF) Sensitivity Guide, is used. This guide is a narrow strip of a special continuous tone gray scale about ½ inch wide and 5 inches long with approximately 21 different densities shown as steps on the guide which are respectively numbered from 1 to 21. The type of continuous tone gray scale causes every other step to transmit one-half the light as the reference step transmits. Such a scale can be used to accurately measure the effective sensitivity of presensitized plates when used as described in the LTF guide. Research Bulletin No. 215, issued by the Lithographic Technical Foundation, Inc., 131 East 39th Street, New York, New York, 1969 describes in detail the sensitivity guide used and is incorporated herein by reference After a presensitized plate has been exposed and developed, observation of the solid and visible step wedges present on the plate will indicate its sensitivity which represents the extent of degradation or dark reaction that has taken place during storage. In general, the lower the number of solid and visible step wedges that appear on the plate, the less sensitive the plate and almost universally the lower the extent of the dark reaction and degradation of the plate that has occurred during storage.

In the experiments listed hereinbelow, the stabilized plates of the present invention produced a substantially lower number of solid and visible step wedges than plates which had been subjected to the same aging conditions yet which contained a different or no stabilizer.

The extent of plate degradation was determined by bench test results in which the plates, after being exposed and developed, were analyzed for image and background qualities. A designation of an image as a "good image" indicates that such image was characterized by clear and sharp definition and that it was exceptionally well representative of the negative. Images which were less satisfactory but which were adequate for printing were given an "o.k" rating. The background quality was also similarly evaluated and rated. A rating of the background in the bench test designated as "clean" indicates that the background is very acceptable and contains essentially no developed sensitizer which would result in an unwanted printed image in such background area. Some scum in such area indicates that degradation of the plate had taken place and that there was some developed photosensitizer in the background area which is not desired and which would result in a printing of background material which is less satisfactory when compared to the negative used to produce the developed plate. Additionally, in evaluating the background, the designation "spots" indicates that less background interference was present than in plates which had scum on them but that such background interference as was present would produce a plate not having as high a quality as the background of one which was designated "clean".

After the plates had printed a selected number of copies, the printed material was observed to determine in the background areas the extent of printing where no printing should result. This is referred to as the press test. A plate which is "clean" would have essentially no unwanted background printing. A "very light scum" indicates a small but noticeable amount of background printing as compared to a clean plate. A designation of "medium scum" indicates the presence of a noticeable amount of background printing while a plate having "heavy scum" characteristics was one in which the background printing was substantially greater and quite noticeable as compared to a medium scum background plate.

An additional observation made in the press test was the extent to which blinding occurs. Blinding is a measure of the oleophilic image area and the speed at which it accepts ink on a lithographic press which occurs in the initial stages during the starting of a printing operation. The lower number of copies needed to eliminate blinding the better the quality of the plate and the less the quantity of wasted copies which are produced from the plate.

EXAMPLE 1

In this example, two anodized plates were prepared for storage tests and thereafter developed and bench and press tested to indicate the effects of the use of an aryl sulfonic acid stabilizer of the present invention.

Anodized brush grained aluminum plates were treated with a heated sub-base solution comprising approximately five percent sodium silicate in an aqueous solvent. The plates were contacted with such sodium silicate solution at about 150° F. Thereafter, one of the plates was roller coated with a two percent aqueous solution (deionized water) of p-chlorobenzene sulfonic acid. After coating, the material was dried with heat. Thereafter, four to five weight percent of Diazo Resin No. 4 (Fairmont Chemical) containing zinc chloride was roller coated on the plate as a sensitizer layer and thereafter dried with heat.

A control plate was produced identical to the methods described above except that the stabilizer layer was not placed on the plate as was done for the plate described above. The control plate and the stabilized plate were stored for fourteen months at room temperature.

Thereafter, the plates were exposed to a standard step wedge for forty-five seconds in a Berkey exposure unit powered at approximately 5 kilowatts. Both plates were then developed with Gard 160 black developer (Richardson Graphics Company).

Both plates were subjected to bench and press tests and, as indicated in the data shown in Table I below, the control plate bench test results indicated lesser quality of image, poor quality half-tone screen and background results and also indicated that the control plate suffered from an inherent dark reaction as indicated by the comparatively higher values for the step wedge in the solid and visible ranges as well as from background scum spots.

The press test results indicated that essentially no blinding had occurred in both the control and the stabilized plate. At roll-up of 1,000 copies, the stabilized plate appeared to be clean at 30 copies while the control had some scum spots. The image quality and background cleanliness for the stabilized plate was excellent and clean throughout the press run, respectively, while similar qualities for the control plate indicated poor mottled and plugged image quality and background cleanliness which was below the printing excellence of the stabilized plate.

The specific qualitative and quantitative results from these two described plates is shown in Table I below.

TABLE I

CONTROL PLATE

Bench Results:
| | |
|---|---|
| Image | Fair, but mottled |
| Half-tone Screen | Badly plugged |
| Background | O.K., but some scum spots |
| Step Wedge: | |
|   Solid | 13 |
|   Visible | 16 |

Press Test Results:
| | |
|---|---|
| Blinding (at start) | O.K. at 10 copies |
| Roll-Up (at 1,000 copies) | Mostly O.K., but some scum spots |
| Run Length | 49,000 |
| Image Quality | Poor, mottled and plugged |
| Background Cleanliness | Mostly O.K., but some scum spots |

STABILIZED PLATE

Bench Results:
| | |
|---|---|
| Image | Good |
| Half-tone Screen | Open |
| Background | Clean |
| Step Wedge: | |
|   Solid | 10 |
|   Visible | 13 |

Press Test Results:
| | |
|---|---|
| Blinding (at start) | O.K. at 10 copies |
| Roll-Up (at 1,000 copies) | Clean at 30 copies |
| Run Length | 49,000 |
| Image Quality | Excellent |
| Background Cleanliness | Clean throughout |

EXAMPLE II

In this example, an accelerated aging test was performed on a control presensitized anodized plate and on a presensitized anodized plate which contained various stabilizers as indicated in the table below. The plates used for all samples in this example and the sub-basing were substantially identical to that described for the plates produced in Example I. The stabilizers, as shown in the table, were roller coated, heat dried and placed on a plate as a separate layer intimately contacting the sub-base layer. The sensitizer consisted of four percent Diazo Resin No. 4, produced by the Fairmont Chemical Company, containing zinc chloride in an aqueous solution. The sensitizer was applied by roller coating methods and then heat dried.

Thereafter, the control plates and plates using the various stabilizers, as indicated in the table below, were stored for two weeks at 110° F. at 70 percent relative humidity conditions. Thereafter, each plate was exposed using identical negative step wedges and selected images for two minutes using Nu-Arc Xenon-Arc. The plates were then developed with a Hi-Contrast red developer and Gum-Asphaltum-Etch (Richardson Graphics Company). The exposure and development of all the plates were substantially identical so as to preclude from the results obtained any influence of varying exposure and development on such results. It is anticipated that such results are indicative of the ability of the selected stabilizers to stabilize plates under accelerated aging conditions.

From the data accumulated, it can be seen that the one and two percent parachlorobenzene sulfonic acid stabilizers produced plates which were substantially better than the bench, step wedge and press tests for all other stabilizers tested as shown.

The results of such testing are shown in Table II below.

TABLE II

| In Humidity Cabinet For: | Stabilizer | Bench Results: Image | Bench Results: Background | Step Wedge: Solid | Step Wedge: Visible | Press Test: Scum on Press |
|---|---|---|---|---|---|---|
| 0 Days | Control, no stabilizer | Good | Clean | 5 | 9 | Clean |
| 14 Days | Control, no stabilizer | O.K. (spots) | Clean | 12 | 18 | Heavy scum |
| 0 Days | 2% p-chlorobenzene sulfonic acid | Good | Clean | 6 | 9 | Clean |
| 14 Days | 2% p-chlorobenzene sulfonic acid | Good | Clean | 8 | 11 | Clean |
| 0 Days | 1% p-chlorobenzene sulfonic acid | Good | Clean | 6 | 9 | Clean |
| 14 Days | 1% p-chlorobenzene sulfonic acid | O.K. | Clean | 10 | 14 | Very light scum |
| 14 Days | Lactic acid/ nitric acid (ph 2) | O.K. | Some scum | 12 | 15 | Heavy scum |
| 14 Days | 1% Salicylic acid | O.K. | Some scum | 13 | 18 | Heavy scum |
| 14 Days | 1% Zinc chloride | O.K. | Some scum | 11 | 14 | Heavy scum |
| 14 Days | 5% Zinc chloride | O.K. | Spots | 9 | 13 | Medium scum |
| 14 Days | 1% Phosphoric acid | O.K. | Some scum | 17 | 21 | Heavy scum |
| 14 Days | 1% Boric acid | Scum | Some scum | — | — | Heavy scum |
| 14 Days | 5% Acetic acid | Scum | Some scum | — | — | Heavy scum |
| 14 Days | 1% Citric acid | Scum | Some scum | — | — | Heavy scum |
| 14 Days | 1% Naphthalene trisulfonic acid | O.K. | Some scum | 12 | 15 | Medium scum |
| 14 Days | 1% Stabilizer "S" (Fairmont) | O.K. | Some scum | 12 | 15 | Heavy scum |

EXAMPLE III

In this example, brush grained lithographic plates made of aluminum were first treated with a sub-base coating comprising a first layer of urea-formaldehyde resin in an aqueous solution of about 0.075 percent.

Such urea-formaldehyde resin was "Amres-212" (Pacific Resins Corporation). A second sub-base layer was placed over the urea-formaldehyde resin and comprised approximately 1.25 weight percent in an aqueous solution of phytic acid produced by Staley Company. Thereafter, Diazo Resin No. 4, as described above, 0.3 percent in an aqueous solution mixed with various stabilizers at concentrations of about 0.08 percent was then placed over the sub-base material. Both the sub-base and sensitizer layers were coated using roller coaters.

After production of the plates, they were exposed for two minutes under a Nu-Arc Xenon Arc and developed with a red 264 developer which was produced by Richardson Graphics Company. The results of press tests on the above plates are shown in Table III below.

TABLE III

| Press Test Results: Stabilizers | Blinding at Start | Run Length | Scum on Press |
| --- | --- | --- | --- |
| Control, no stabilizer | O.K. at 40 copies | 1,000+ copies | Scum |
| p-Chlorobenzene sulfonic acid (Na Salt) | O.K. at 50 copies | 1,000+ copies | Clean |
| Phosphoric Acid | O.K. at 13 copies | Short run | Scum |
| Citric Acid | O.K. at 20 copies | Short run | Scum |
| Boric Acid | O.K. at 13 copies | Short run | Scum |
| Oxalic Acid | O.K. at 30 copies | Short run | Scum |
| Itaconic Acid | O.K. at 20 copies | Short run | Scum |
| Crotonic Acid | O.K. at 30 copies | 1,000+ copies | Scum |
| Maleic Acid | O.K. at 50 copies | Short run | Scum |
| Salicylic Acid | O.K. at 20 copies | 1,000+ copies | Scum |
| Molybdic Acid | O.K. at 50 copies | Short run | Scum |
| Phosphotungstic Acid | O.K. at 30 copies | 1,000+ copies | Scum |
| Tartaric Acid | O.K. at 40 copies | 1,000+ copies | Scum |
| Napthalene trisulfonic acid | Blind | Short run | Clean |
| Analine disulfonic acid | O.K. at 200 copies | 1,000+ copies | Scum |
| Congo Red | O.K. at 30 copies | 1,000+ copies | Scum |
| Zirconium acetate | O.K. at 70 copies | Short run | Scum |

EXAMPLE IV

A presensitized plate was prepared by brush graining and anodizing 1100 Aluminum Alloy sheets. The sheets were then sub-based with a sodium silicate solution. The control plate was then coated with Diazo Resin No. 4 followed by a coating of a phenoxy cinnamate photopolymer of the type described in U.S. Pat. No. 3,808,004. A plate embodying the present invention was similarly prepared except that after sub-basing with the sodium silicate, a coating of p-chlorobenzene sulfonic acid was applied. The various coating weights were as follows: silicate estimated at less than 1 milligram per square foot, p-chlorobenzene sulfonic acid about 1½ milligrams per square foot, Diazo Resin No. 4 about 5 milligrams per square foot and the phenoxy cinnamate photopolymer about 65 milligrams per square foot. The control plate showed evidence of deterioration after one month. The plate embodying this invention, however, was undeteriorated after one year's storage under similar ambient conditions.

The foregoing example clearly demonstrates that the stabilizers of the present invention are responsible for substantially enhanced stability in diazo resin presensitized plates having an anodized aluminum plate base and that these stabilizers are essential to the commercial production of such presensitized plates which have extended storage capability.

Example IV also demonstrates that the stabilizers of the present invention find advantageous utility in presensitized lithographic plates which have a photopolymer coating over a diazo resin such as, for example, as is described in U.S. Pat. No. 3,808,004, the disclosure of which is incorporated herein by reference. Preferred photopolymer coatings which can be used in conjunction with the diazo resins in plates embodying the present invention include the cinnamate photopolymers, with the combination of a phenoxy cinnamate photopolymer over a diazo resin being highly satisfactory as the sensitizer layer in the presensitized plates of the present invention. Such composite sensitizers are characterized by substantially increased photospeeds (reduced exposure times) and when combined with the stabilizers of the present invention produce presensitized lithographic plates characterized by high photospeeds, improved stability and storage capability.

EXAMPLE V

In this example, an illustrative embodiment of the presensitized plate of the present invention is prepared by brush graining and anodizing 1100 Aluminum Alloy sheets. These sheets are then sub-based with a sodium silicate solution. The plates are then coated with a toluene sulfonic acid solution, dried and again coated with a solution of Diazo Resin No. 4 in the same manner as described previously in Example IV. Comparison between the presensitized plate of this example with the control plate of Example IV demonstrated that the toluene sulfonic acid stabilizer also is responsible for substantially extended storage capability, enabling these presensitized plates to be stored over prolonged periods of time without loss of image quality or printing performance.

While in the foregoing specification certain embodiments and examples of this invention have been described in detail, it will be appreciated that modifications and variations therefrom will be apparent to those skilled in this art. Accordingly, this invention is to be limited only by the scope of the appended claims.

I claim:

1. A presensitized lithographic plate consisting essentially of an anodized aluminum plate base, a hydrophilic and olephobic silicate sub-base coating on said plate base, a sensitizer coating overlying said sub-base coating comprising a water soluble photosensitive diazo resin, and a water soluble aryl sulfonic acid based stabilizer selected from the group consisting of p-chlorobenzene sulfonic acid, and alkali metal salts thereof, said stabilizer being interposed as a separate layer between said sub-base coating and said sensitizer coating.

2. The presensitized lithographic plate of claim 1, wherein said stabilizer separate layer between said sub-base and sensitizer coatings has been dried prior to application of said sensitizer coating.

3. The presensitized lithographic plate of claim 1, wherein said sensitizer coating includes a cinnamate photopolymer layer over the water soluble diazo resin layer.

4. The presensitized plate of claim 1, wherein said sensitizer coating includes a phenoxy cinnamate photopolymer layer over the water soluble diazo resin layer.

* * * * *

UNITED STATES PATENT AND TRADEMARK OFFICE
CERTIFICATE OF CORRECTION

PATENT NO. : 4,230,492

DATED : October 28, 1980

INVENTOR(S) : Daniel C. Thomas

It is certified that error appears in the above-identified patent and that said Letters Patent are hereby corrected as shown below:

Column 3, line 4, "hydroethyl" should be --hydroxyethyl--.

Column 4, line 22, "substitute" should be --substituent--.

Column 4, line 43, "benzoylamine" should be --benzoylamino--.

Signed and Sealed this

Third Day of March 1981

[SEAL]

Attest:

RENE D. TEGTMEYER

Attesting Officer    Acting Commissioner of Patents and Trademarks